United States Patent [19]

Sano et al.

[11] Patent Number: 5,339,370
[45] Date of Patent: Aug. 16, 1994

[54] OPTICAL MODULATOR AND OPTICAL COMMUNICATION SYSTEM UTILIZING THE SAME

[75] Inventors: Hirohisa Sano, Kokubunji; Hiroaki Inoue, Saitama, both of Japan

[73] Assignee: Hitachi, Ltd., Tokyo, Japan

[21] Appl. No.: 47,339

[22] Filed: Apr. 16, 1993

Related U.S. Application Data

[63] Continuation of Ser. No. 682,678, Apr. 9, 1991.

[30] Foreign Application Priority Data

Apr. 12, 1990 [JP] Japan ................................ 2-94942

[51] Int. Cl.$^5$ .................................................. G02B 6/10
[52] U.S. Cl. .............................................. 385/2; 385/131; 359/245; 359/278
[58] Field of Search .............................. 385/1–4, 385/8, 40, 24, 14, 129, 131, 130; 359/245–248, 278; 257/82

[56] References Cited

U.S. PATENT DOCUMENTS 4,093,345 6/1978 Logan et al. ........................... 385/2
4,847,573 7/1989 Fukuzawa et al. .................... 357/17

FOREIGN PATENT DOCUMENTS 0361651 4/1990 European Pat. Off. .
2191015 12/1987 United Kingdom .
2243456 10/1991 United Kingdom ................. 385/131

OTHER PUBLICATIONS

Wood, Thomas H., "Multiple Quantum Well (MQW) Waveguide Modulators", Journal of Lightwave Technology, vol. 6, No. 6, Jun. 1988; pp. 743–757.

Primary Examiner—Rodney B. Bovernick
Assistant Examiner—John Ngo
Attorney, Agent, or Firm—Kenyon & Kenyon

[57] ABSTRACT

An optical modulator includes two cladding layers of different conductive types, a light absorption layer formed between the cladding layers for propagating incident light and for absorbing the light in response to a voltage applied between the cladding layers, and an optical waveguide layer formed between the cladding layers and optically connected to the light absorption layer, for propagating the light.

25 Claims, 7 Drawing Sheets

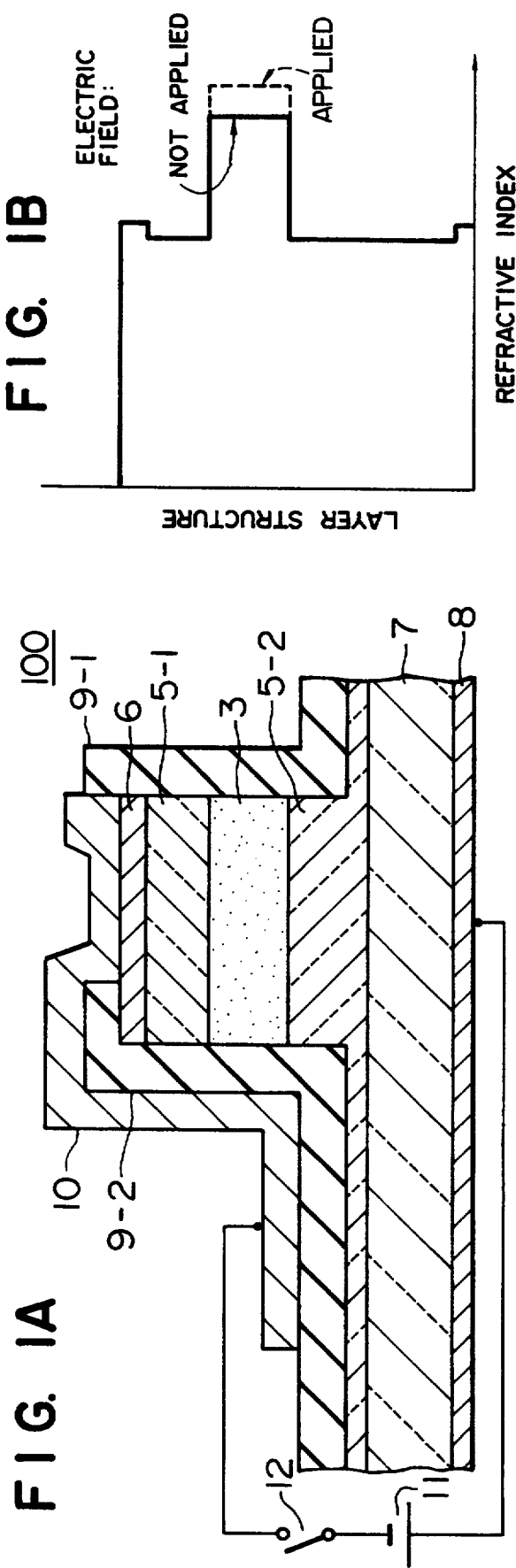
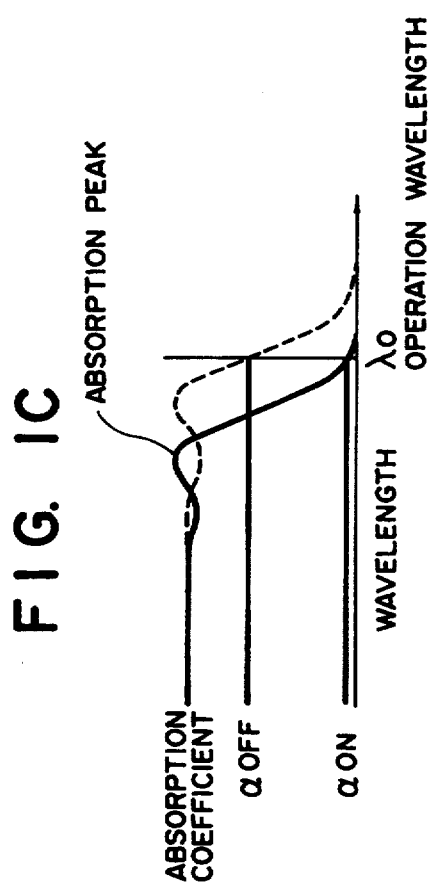
FIG. 1A
FIG. 1B
FIG. 1C

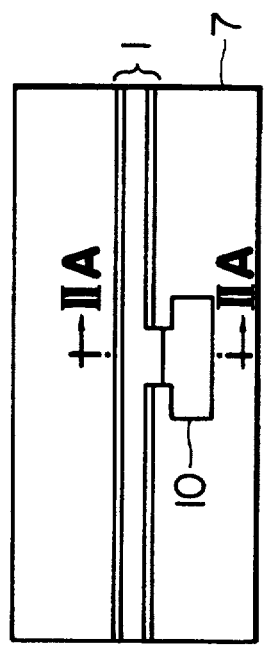
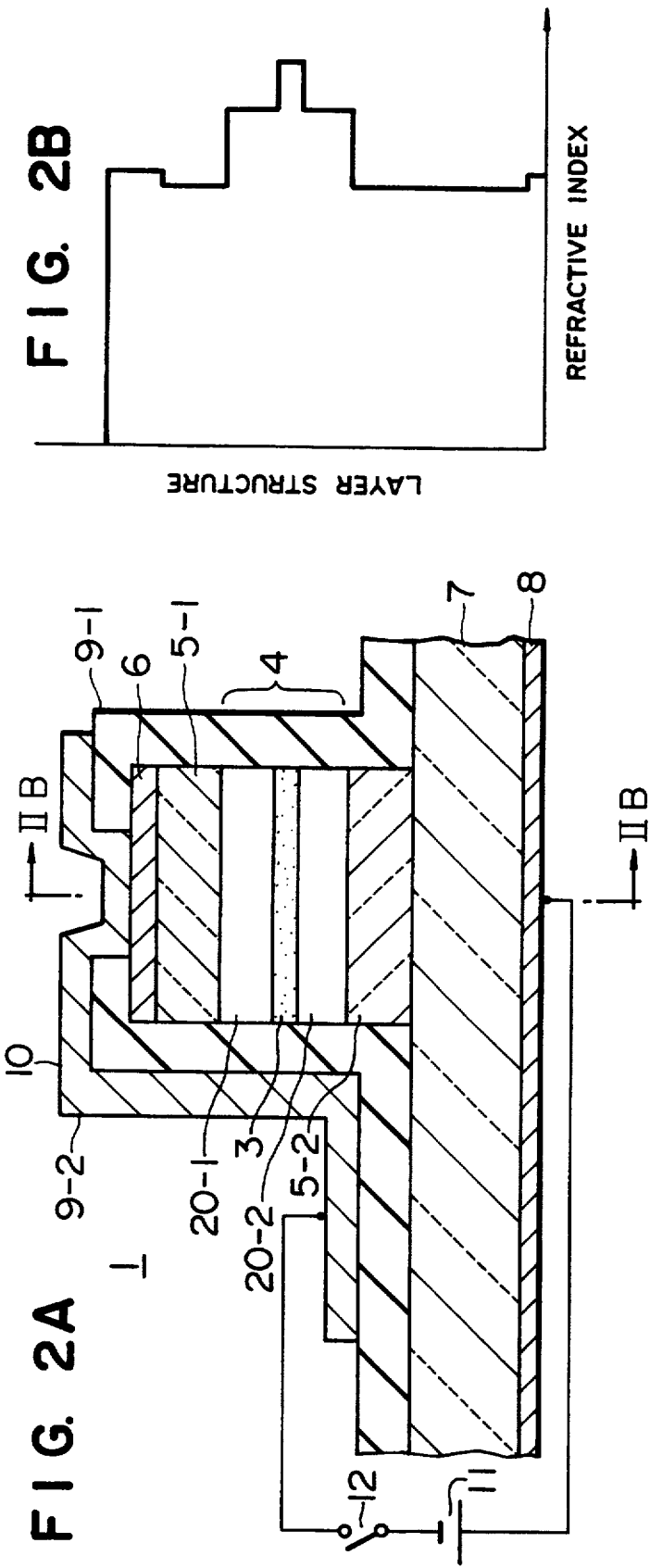

OPTICAL MODULATOR AND OPTICAL COMMUNICATION SYSTEM UTILIZING THE SAME

This application is a continuation of U.S. patent application Ser. No. 07/682,698 filed on Apr. 9, 1991.

BACKGROUND OF THE INVENTION

1. Field of the Invention

The present invention relates to an optical modulator used in an optical transmitter of the external modulation type, an ultra high speed optical fiber communication system using the above optical modulator, and an integrated circuit made up of optical elements such as a laser diode and the above optical modulator.

2. Description of the Related Art

Optical modulators of various types have previously been proposed. A typical one of these optical modulators is an optical modulator of the electroabsorption type (refer to an article entitled "InGaAlAs/InAlAs Multiple Quantum Well Optical Modulators" by K. Wakita et. al., IOOC89, 19C2-2). FIG. 1A shows a basic structure of this optical modulator 100. Referring to FIG. 1A, an optical modulator 100 includes an optical waveguide which is formed on a substrate 7, and which has a rib structure of a width of several microns. The optical waveguide has a structure that a light absorption layer 3 made of an undoped layer, i.e., an intrinsic layer is sandwiched between a pair of cladding layers 5-1 and 5-2 which are smaller in refractive index than the light absorption layer 3, as shown in FIG. 1B. The side walls of the optical waveguide are coated with an insulating film. Further, in order to apply an electric field to the undoped layer 3, the upper cladding layer 5-1 and the lower cladding layer 5-2 are doped with a p-type impurity and an n-type impurity, respectively- Thus, a diode of the p-i-n type is formed in the optical waveguide. When a reverse bias voltage is applied across the diode by turning on a switch 12, a strong electric field is applied to the undoped light absorption layer 3.

The light absorption layer is usually made of a bulk semiconductor such as InGaAsP, or formed of InGaAs/InAlAs of a multiple quantum well structure. As shown in FIG. 1B, when an electric field is applied to the undoped layer 3, a spectrum indicating the wavelength dependence of the absorption coefficient of the light absorption layer 3 is shifted to the long wavelength side, on the basis of the Franz-Keldysh effect for the bulk semiconductor or the quantum confined Stark effect for the semiconductor of the multiple quantum well structure. FIG. 1C shows the above shift of the spectrum in correspondence with the structure shown in FIG. 1A. When a wavelength of incident light is set to be $\lambda_o$, and an electric field is applied to the light absorption layer 3, an absorption coefficient of the layer 3 is increased from $\alpha_{on}$ to $\alpha_{off}$. That is, an ON-OFF control can be made for light propagation, and thereby the intensity modulation of the incident light can be efficiently carried out.

As can be seen from the above, an optical modulator of the electroabsorption type is small in size, i.e., has a length of hundreds of microns, operates on a low voltage such as several volts, and can form an integrated circuit together with another optical element. That is, this optical modulator is very advantageous.

However, in the optical modulator of the electroabsorption type, there arises a problem that change in refractive index of the light absorption layer due to the application of an electric field thereto brings about phase modulation. Thus, the spectral width of output light from the modulator is enlarged, and the so-called chirping phenomenon occurs.

SUMMARY OF THE INVENTION

The present invention provides an optical modulator which can prevent generation of a chirping phenomenon due to the phase modulation occurring simultaneously with intensity modulation.

The present invention also provides an optical communication system utilizing the above optical modulator.

The present invention further provides an optical integrated circuit made up of a laser diode and the above optical modulator.

An optical modulator according to the present invention includes two cladding layers of different conductive types, a light absorption layer formed between the cladding layers for propagating incident light and for absorbing the incident light in response to a voltage applied between the cladding layers, and an optical waveguide layer formed between the cladding layers for propagating the incident light.

As mentioned above, an optical modulator according to the present invention includes a light absorption layer for carrying out intensity modulation for the incident light by changing an absorption coefficient of the light absorption layer, and an optical waveguide layer for compensating for the change in refractive index of the light absorption layer. Therefore, it is possible to control the phase modulation effect which occurs in carrying out intensity modulation for the incident light, and the chirping phenomenon can be suppressed. Further, when the structure and operation wavelength of the optical modulator are appropriately selected, negative chirping can be generated, and thus transmission characteristics when the intensity-modulated light is transmitted through an optical fiber, can be greatly improved.

BRIEF DESCRIPTION OF THE DRAWINGS

FIG. 1A is a sectional view showing a conventional optical modulator;

FIG. 1B is a graph showing the refractive-index distribution in the optical modulator of FIG. 1A;

FIG. 1C is a graph showing that a spectrum indicating wavelength dependence of absorption coefficient of a light absorption layer is shifted to the long wavelength side by applying a voltage across the light absorption layer;

FIG. 2A is a sectional view showing a first embodiment of an optical modulator according to the present invention;

FIG. 2B is a graph showing the refractive-index distribution in the first embodiment of FIG. 2A;

FIG. 2C is a plane view of the first embodiment of FIG. 2A;

DESCRIPTION OF THE PREFERRED EMBODIMENTS

Figure 3A:
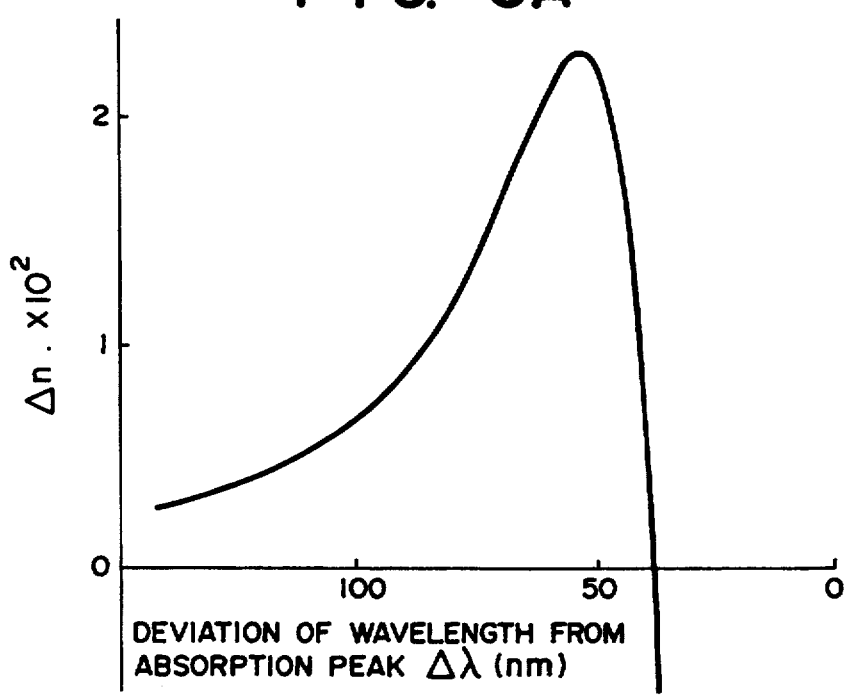
FIG. 3A is a graph showing a spectrum of change in refractive index.

An optical communication system according to the present invention will be explained below in detail, with reference to the drawings.

A first embodiment of an optical modulator according to the present invention which embodiment is used in a transmitter of the above optical communication system, will first be explained, with reference to FIGS. 2A to 2C.

In the conventional optical modulator of the electroabsorption type, the light absorption layer is made higher in refractive index than the cladding layers, so that incident light is confined in and guided by the light absorption layer. While, an optical modulator according to the present invention includes, in addition to a light absorption layer, at least one optical waveguide layer for cancelling change in refractive index of the light absorption layer by change in its refractive index, thereby preventing generation of the chirping phenomenon. In other words, the inventive optical modulator includes a light absorption layer for modulating intensity of incident light by changing its absorption coefficient, and an optical waveguide layer for compensating for the change in refractive index of the light absorption layer.

FIG. 2C is a plane view showing the first embodiment of the optical modulator according to the present invention, FIG. 2A is a sectional view taken along the line IIA—IIA of FIG. 2C, and FIG. 2B is a graph showing the refractive-index distribution along the line IIB—IIB in the first embodiment of FIG. 2A. As shown in FIG. 2A, the optical waveguide 1 of the rib type is formed on a substrate 7. A lower cladding layer 5-2, a lower optical waveguide layer 20-2, a light absorption layer 3, an upper optical waveguide layer 20-1, an upper cladding layer 5-1, and a cap layer 6 are laminated on the substrate 7 to form the modulator 1. The side walls of the optical waveguide 1 of the rib type are protected by insulating films 9-1 and 9-2. A metal layer 10 connected to the cap layer 6 is provided on the insulating films 9-1 and/or 9-2 to form a connection pad. Another metal layer 8 is formed on the rear surface of the substrate 7. Further, a D.C. power source 11 and a switch 12 are connected in series between the metal layers 8 and 10 so that the metal layer 8 can be at a positive potential with respect to the metal layer 10. Thus, a positive potential can be intermittently applied to the metal layer 8 by operating the switch 12.

The substrate 7 and the lower cladding layer 5-2 are made of n-type material such as n-InP, while the upper cladding layer 5-1 is made of p-type material such as p-InP. In a case where desired crystal growth can be made on the surface of the substrate without producing any problem, the lower cladding layer 5-2 can be omitted. Further, one of the optical waveguide layers 20-1 and 20-2 may be omitted. Further, the layers 20-1 and 20-2 may be separated from the layer 3 if the former is optically connected to the latter.

The light absorption layer 3 has an absorption edge at a wavelength which is a little shorter than a wavelength of incident light, and is made of a compound semiconductor such as InP, GaAs, InGaAs, GaAlAs. In general, the optical waveguide layers 20-1 and 20-2 are made of the same material as used for making the light absorption layer 3. The material of the waveguide layers, however, may be different from that of the light absorption layer.

The optical waveguide layers 20-1 and 20-2 have an absorption edge at a wavelength shorter than a wavelength corresponding to the absorption edge of the light absorption layer 3, and are higher in refractive index than the cladding layers 5-1 and 5-2.

At least a portion of the light absorption layer 3, or the entire layer 3 and at least a portion of the optical waveguide layers 20-1 and 20-2 are undoped. Further, the upper cladding layer 5-1 and the lower cladding layer 5-2 (or the substrate) are doped with impurities of different conduction types. Thus, a p-i-n structure is formed.

Chirping quantity of an optical modulator is greatly dependent on the degree of phase modulation accompanied by intensity modulation. The degree of phase modulation is proportional to total change $\Delta N_{total}$ in refractive indexes of layers of the optical modulator for propagated light. In the optical modulator of the present invention, the total change $\Delta N_{total}$ is given by the following equation:

$$\Delta N_{total} = \Gamma_1 \times \Delta n_1 + \Gamma_2 \times \Delta n_2 + \Gamma_3 \times \Delta n_3$$

where $\Gamma_1$, $\Gamma_2$ and $\Gamma_3$ indicate light confinement factors of the light absorption layer 3 and the optical waveguide layers 20-1 and 20-2, respectively, and $\Delta n_1$, $\Delta n_2$ and $\Delta n_3$ indicate the changes in refractive indexes of the layers 3, 20-1 and 20-2, respectively. In order to eliminate the degradation of propagation characteristics, it is necessary to select the structure of the optical modulator so that a condition $\Delta N_{total} \leq 0$ is satisfied. That is, it is necessary to select the thickness, width and material of each of the light absorption layer 3 and the optical waveguide layers 20-1 and 20-2 under the above condition.

In order to satisfy the above condition, a crystal growing direction of the optical waveguide layers 20-1 and 20-2 is selected so that the change in refractive index of each layer 20-1, 20-2 for the propagated light due to the electrooptic effect becomes negative. For example, when plane orientation of a base layer and the direction of applied electric field is [100], a growing direction of the crystal used as the optical waveguide layers 20-1 and 20-2 is desirably [011]. Or, when the plane orientation of the base layer and the direction of applied electric field are [001], the growing direction of the crystal used as the optical waveguide layers is desirably [110].

Thus, the thickness and material of each of the light absorption layer 3 and the optical waveguide layers 20-1 and 20-2 can be selected so that the total change $\Delta N_{total}$ in refractive indexes, which is determined by a sum of the products of the light confinement factor of each of the layers 3, 20-1 and 20-2 and change in refractive index of each layer, becomes equal to or less than zero.

As shown in FIGS. 2A and 2B, the optical waveguide layers 20-1 and 20-2 are made in the form of a rib. The light absorption layer 3 is a little higher in refractive index than the optical waveguide layers 20-1 and 20-2, which are a little higher in refractive index than the cladding layers 5-1 and 5-2 and the substrate 7. Thus, incident light is confined and propagated in the light absorption layer 3 and the optical waveguide layers 20-1 and 20-2. At least a part of a region designated by reference numeral 4 in FIG. 2A is undoped. Further, the upper layer and the lower layer and substrate are doped to form layers of different conductive types. That is, the upper cladding layer 5-1 is doped with a p-type impurity, and the lower cladding layer 5-2 and the substrate 7 are doped with an n-type impurity. Thus, a diode of the p-i-n type is formed. When a reverse bias voltage is applied to this diode, a strong electric field is applied to the undoped region 4, and the absorption coefficient of the light absorption layer 3 for the incident light is changed on the basis of change in band structure of the undoped layer due to the applied electric field (that is, the Franz-Keldysh effect or the quantum confined Stark effect), to modulate the intensity of the incident light.

The change in refractive index of each of the optical waveguide layers 20-1 and 20-2 is caused by the electrooptic effect, as described above, compound semiconductors such as InP and GaAs generally show the electrooptic effect. When an electric field is applied to such a compound semiconductor, the refractive index of the compound semiconductor is changed. Accordingly, when at least a portion of the optical waveguide layers 20-1 and 20-2 is undoped and an electric field is applied to the undoped portion as well as the light absorption layer 3, it is possible to cancel the change in refractive index of the light absorption layer 3 by the change in refractive index of the undoped portion. It is to be noted that the change in refractive index due to the electrooptic effect is anisotropic. Accordingly, it is necessary to appropriately select a crystal growing direction of the optical waveguide layers 20-1 and 20-2. Further, the thickness of the light absorption layer 3 can be set to be a desired value, since the light absorption layer 3 is formed separately from the optical waveguide layers 20-1 and 20-2. Thus, the light absorption layer 3 can be formed of a thin film, to reduce the adverse effect of the change in refractive index. Further, polarity of the change in refractive index is reversed in the vicinity of an absorption peak. The chirping phenomenon causes a serious problem when an increase in refractive index is caused. However, a decrease in refractive index improves propagation characteristics. In order that the operation wavelength of the optical modulator is made to approach an absorption peak, thereby reversing the polarity of the change in refractive index, it is necessary to form the light absorption layer 3 of a thin film. In the conventional optical modulator, however, when a light absorption layer is formed of a thin film, a light guiding mode approaches a cut-off state, and thus propagation characteristics are degraded. That is, the thickness of the light absorption layer cannot be made thinner than a predetermined value.

Figure 3B:
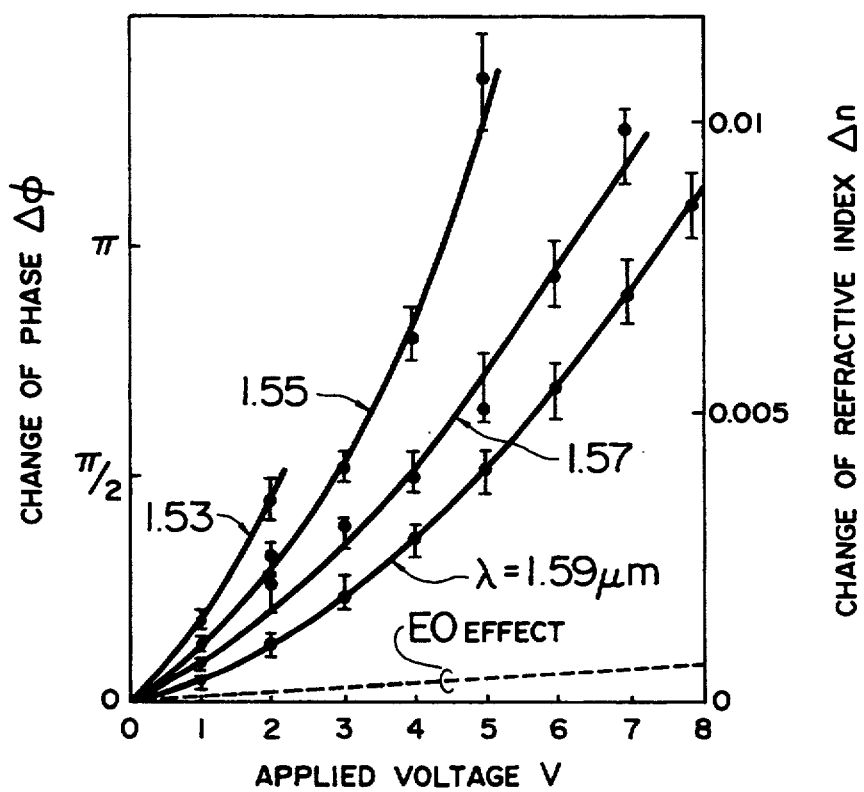
FIG. 3B is a graph showing phase modulation characteristics.

As has been already mentioned, when an electric field is applied to the light absorption layer 3, the light absorption coefficient and refractive index of the light absorption layer 3 are changed at the same time. FIG. 2B is a graph showing the refractive-index distribution along the line IIB-IIB of FIG. 2A. FIG. 3A is a graph showing the wavelength dependence of change in refractive index when the light absorption layer 3 is formed of an InGaAs/InAlAs multiple quantum well structure. As shown in FIG. 3A, the change in refractive index due to an applied electric field is positive in a wavelength range spaced apart from an absorption peak, and is negative in the vicinity of the absorption peak. In a conventional optical modulator, the operation wavelength is set in a wavelength range spaced apart from the absorption peak. Accordingly, a change in refractive index due to an applied electric field is positive. When a modulated light signal is propagated in an optical fiber, the chirping due to the positive change in refractive index enlarges the waveform of the modulated light signal, and thus propagation characteristics are degraded. On the other hand, the negative change in refractive index contracts the waveform of the modulated light signal, and thus propagation characteristics are improved. Accordingly, when light from an optical modulator is propagated in an optical fiber, the change in refractive index due to an applied electric field is preferably made to be a negative value rather than zero. FIG. 3B is a graph showing measured values of the phase modulation characteristics of a conventional optical modulator (having no optical waveguide layer). Further, in FIG. 3B, a broken line shows a change in refractive index of InP due to the electrooptic effect when this InP is applied with the same electric field as applied to the optical modulator. In this case, light is propagated in the [011] direction of the InP. As can be seen from FIG. 3B, the change in refractive index of the light absorption layer 3 is several times that of the above InP. Accordingly, when the light confinement factor of the optical waveguide layers 20-1 and 20-2 is made to be several times larger than that of the light absorption layer 3 and the change in refractive index of the optical waveguide layers is made opposite in polarity to that of the light absorption layer 3, the effect of the change in refractive index of the light absorption layer for guided light can be cancelled by that of the change in refractive index of the optical waveguide layers.

Further, when the optical waveguide layers 20-1 and 20-2 are provided in addition to the light absorption layer 3, the thickness of the light absorption layer 3 can be changed, independently of light guiding characteristics. As shown in FIG. 3A, the change in refractive index of the light absorption layer 3 is negative in a wavelength range proximate to an absorption peak. In the conventional optical modulator, however, it is impossible to set the operation wavelength in the above wavelength range, since incident light is strongly absorbed.

On the other hand, in the optical modulator according to the present invention, the light absorption of the light absorption layer 3 in an ON-state, i.e., in a state that the light absorption layer is not applied with an electric field to transmit incident light can be reduced by forming the light absorption layer of a thin film. Thus, it is possible to utilize a wavelength range where the change in refractive index of the light absorption layer 3 is negative. In this case the change in light absorption coefficient is far larger than that in a wavelength region spaced apart from the absorption peak. Accordingly, it scarcely degrades propagation characteristics to form the light absorption layer 3 of a thin film.

Figure 4:
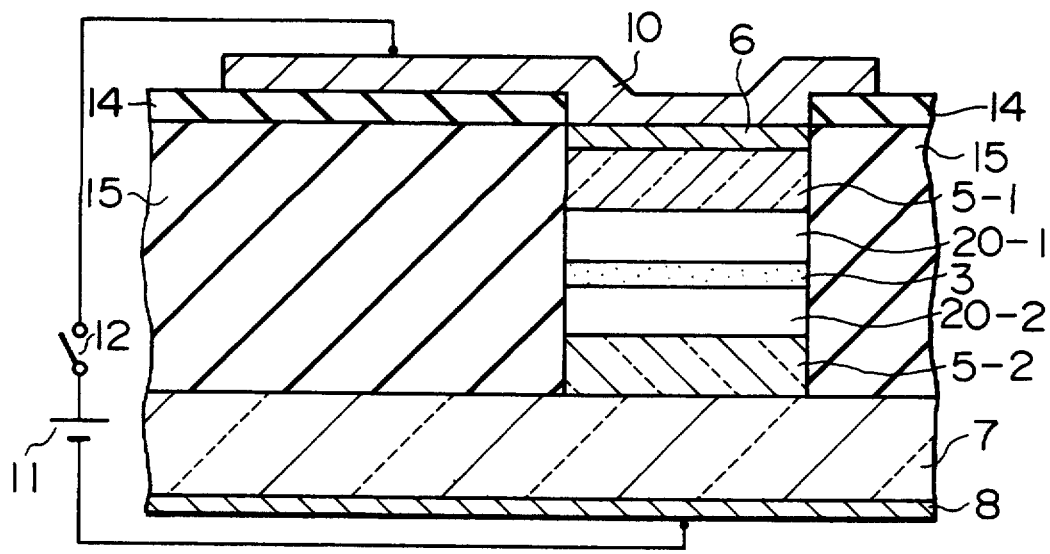
FIG. 4 is a sectional view showing a second embodiment of an optical modulator according to the present invention.

FIG. 4 is a sectional view showing a second embodiment of the optical modulator according to the present invention. In the embodiment of FIG. 4, the optical waveguide 1 is buried in a semi-insulative cladding layer 15, to form a substantially rectangular light guiding region. Thus, according to the present embodiment, light guiding characteristics can be improved, and propagation loss can be reduced. Further, the intensity distribution of guided light can be controlled to be an almost circular distribution, and thus loss due to the Coupling of the optical modulator with an optical fiber can be reduced.

Figure 5:
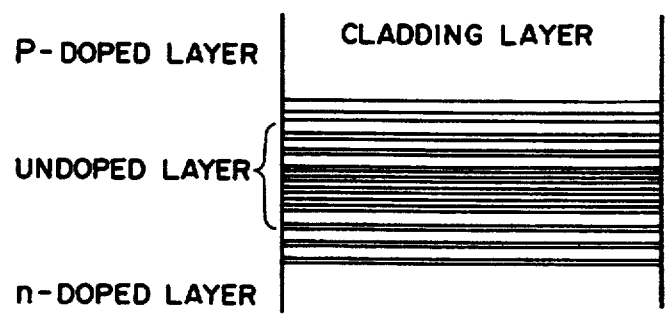
FIG. 5 is a sectional view showing a main part of a third embodiment of an optical modulator according to the present invention.

FIG. 5 is an enlarged view showing the light guiding region of a third embodiment of the optical modulator according to the present invention. A characteristic feature of the embodiment of FIG. 5 resides in that each of the light absorption layer 3 and the optical waveguide layers 20-1 and 20-2 is formed of the multiple quantum well structure. The refractive index and wavelength of the absorption peak of the multiple quantum well (MQW) structure layer can be precisely and independently controlled by the thickness of each of the well and barrier portions of the MQW structure layer. Accordingly, the light absorption layer 3 and the optical waveguide layers 20-1 and 20-2 can be made of the materials of the same types such ks GaAs and GaAlAs, and InP and InAlP and only a single process for the crystal growth of these layers is required. Thus, processes for the crystal growth of each of the optical waveguide layers 20-1 and 20-2 and the light absorption layer 3 are not required and moreover the refractive index of each of the layers 3, 20-1 and 20-2 can be precisely controlled.

Figure 6A:
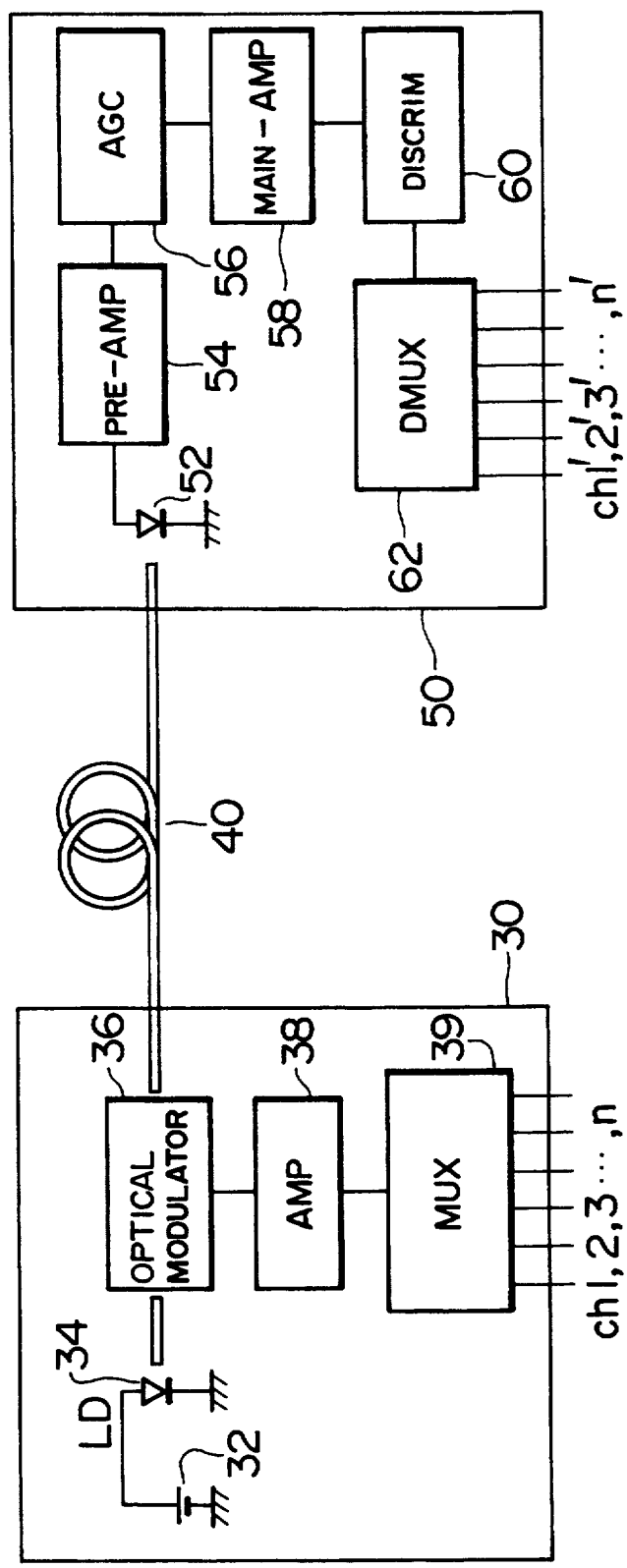
FIG. 6A is a block diagram showing a first embodiment of an optical communication system according to the present invention.
Figure 6B:
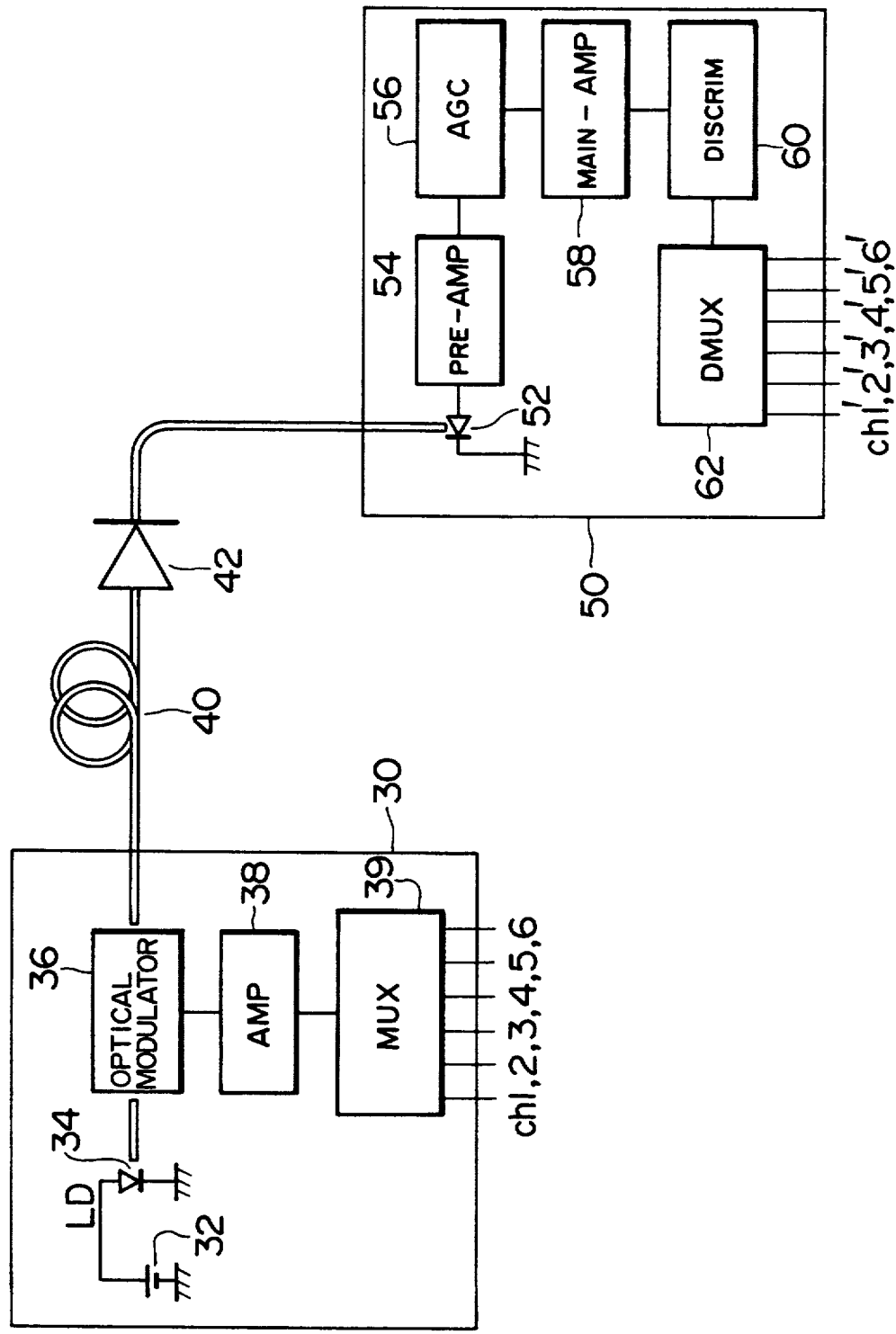
FIG. 6B is a block diagram showing a second embodiment of an optical communication system according to the present invention.

FIGS. 6A and 6B show first and second embodiments of an optical communication system including the optical modulator according to the present invention, respectively. In more detail, FIG. 6A shows a case where a single-mode optical fiber is used as a transmission line, and FIG. 6B shows a case where an optical amplifier is disposed in the course of a transmission line to increase a transmission distance. An external modulation system using an optical modulator is used for the long distance transmission of a high-speed signal more than 1 Gb/s. The above embodiments are used for this purpose.

Referring to FIG. 6A, the first embodiment is mainly made up of a transmitter 30, a single-mode optical fiber 40, and a receiver 50. The transmitter 30 includes a laser diode 34, a power source 32 for supplying a D.C. current to the laser diode 34, the optical modulator 36 according to the present invention, an amplifier 38, and a multiplexer 39. The receiver 50 includes a photo-diode 52 for receiving light from the optical fiber 40, a pre-amplifier 54, an automatic gain control (AGC) circuit 56, a main amplifier 58, a discriminator 60, and a demultiplexer 62.

Light emitted from the laser diode 34 is incident to the optical modulator 36. A plurality of information from communication channels ch1, ch2, ---chn are multiplexed by the multiplexer 39 the output of which is amplified by the amplifier 38 and is then supplied to the optical modulator 36. The optical modulator 36 carries out intensity modulation for incident light from the laser diode 34 in accordance with the output voltage of the amplifier 38. The intensity-modulated light thus obtained is supplied to the optical fiber 40. In the receiver 50, light from the optical fiber 40 is converted by the photo-diode 52 into an electric signal, which is amplified by the pre-amplifier 54. The gain of the output of the pre-amplifier 54 is adjusted by the automatic gain control circuit 56, the output of which is amplified by the main amplifier 58 and is then supplied to the discriminator 60. In the discriminator 60, an information component is extracted from the output signal of the main amplifier 58, to be supplied to the demultiplexer 62. In the demultiplexer 62, the information component is decomposed into a plurality of information, which are supplied to communication channels ch1', ch2', ---, chn'. The second embodiment of FIG. 6A of FIG. 6B is different from the first embodiment only in that an optical amplifier 42 is disposed in the Course of the optical fiber 40.

In such an optical communication system, the transmission distance is limited by the degradation of the waveform of a light signal due to the light dispersion characteristics of the optical fiber. The optical modulator 36 is incorporated in the transmitter 30, and carries out intensity modulation for light emitted from the laser diode 34, in accordance with the electric signal from the amplifier 38. Thus, the optical modulator 36 generates intensity-modulated light which is smaller in chirping than the output light of a laser diode of the direct modulation type (that is, laser diode whose drive current is modulated to carry out intensity modulation of light). Hence, the degradation of signal waveform due to light dispersion characteristics of the single-mode optical fiber is greatly reduced. Accordingly, it is possible to elongate the transmission distance, and a cost necessary for constructing the communication system is greatly reduced. Further, according to the second embodiment of FIG. 6B, the optical amplifier 42 is disposed in the course of the transmission line, and thus it is not required to take the loss due to the transmission line into consideration. Accordingly, the transmission distance is limited only by the degradation of the waveform of a light signal. Hence, the optical modulator according to the present invention can exhibit a remarkable effect.

Figure 7A:
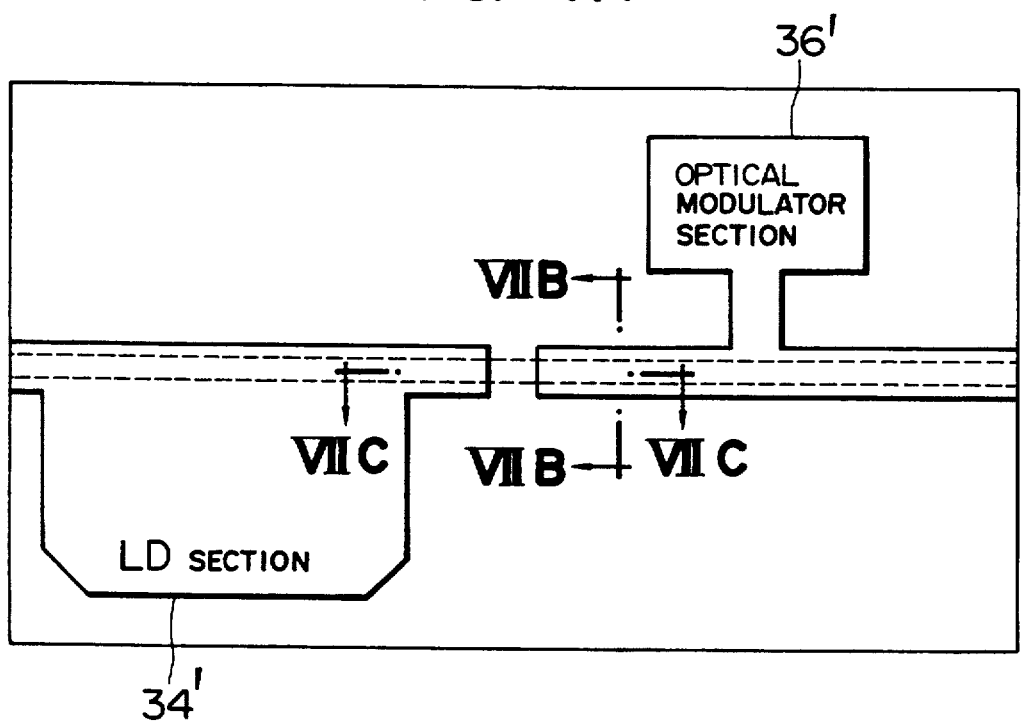
FIG. 7A is a plane view showing an integrated circuit which is made up of a laser diode and an optical modulator, and is used in a transmitter unit of an optical communication system.
Figure 7B:
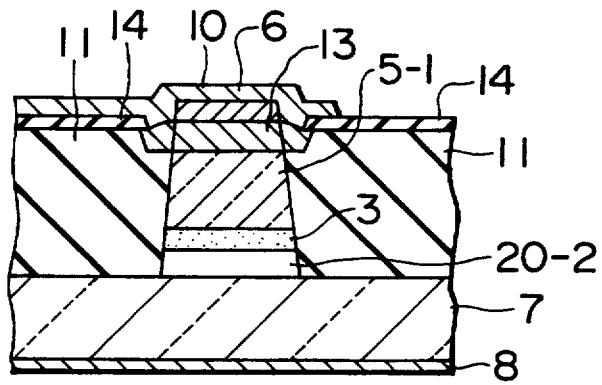
FIG. 7B is a sectional view showing the optical modulator of the integrated circuit.
Figure 7C:
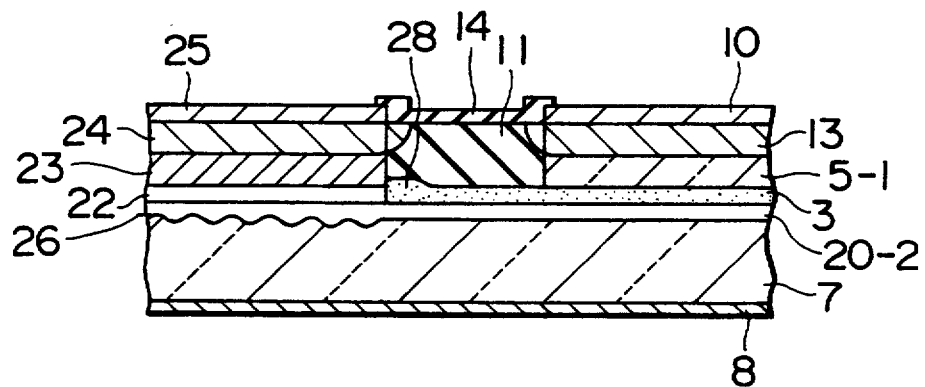
FIG. 7C is a sectional view showing the interconnection between the laser diode and optical modulator of the integrated circuit.

The present invention is also effective in forming an integrated circuit of an optical modulator and a different optical element. FIGS. 7A to 7C show an embodiment of an integrated circuit made up of a laser diode and the optical modulator according to the present invention. In more detail, FIG. 7A is a plane view showing the above embodiment, FIG. 7B is a sectional view taken along the line VIIB—VIIB of FIG. 7A for showing the cross section of the optical modulator section, and FIG. 7C is a sectional view taken along the line VIIC—VIIC of FIG. 7A for showing the cross section of the connection part between the optical modulator section and a laser diode section. In FIG. 7A, reference numeral 34' designates the laser diode section, and reference numeral 36' designates the optical modulator section.

Referring to FIG. 7B showing the cross section of the optical modulator section 36', the structure of the optical modulator section 36' is basically similar to that of the embodiment of FIG. 4. The optical modulator section 36', however, does not include the lower cladding layer 5-2 and the upper optical waveguide layer 20-1, but the substrate 7 made of n-InP plays the role of the lower cladding layer 5-2. Further, a silicon nitride (SIN) layer 14 is formed on the semi-insulative layer 11 to serve as an insulating film and to protect the layer 11 from the influence of the outside. The metal layer 10 is put in ohmic contact with the upper cladding layer 5-1 through the cap layer 6 and a diffusion layer 13, in which zinc is injected or diffused.

Referring to FIG. 7C showing the cross section taken along the line VIIC—VIIC of FIG. 7A, the laser diode section 34' includes the optical waveguide layer 20-2 formed on the substrate 7, an active layer 22, a compound semiconductor layer 23 made of, for example, p-InP or P-InGaAsP, a Zn-doped layer 24, and a metal layer 25. A grating 26 is formed between the optical waveguide layer 20-2 and the substrate 7, to emit coherent light having a constant wavelength.

The optical modulator section 36' has the structure shown in FIG. 7B, and the connection part between the optical modulator section 36' and the laser diode section 34' includes the semi-insulative layer 11 made of Fe-doped InP, and the insulating layer 14 formed on the layer 11 and made of SiN. Incidentally, the light absorption layer 3 is extended to the end face of the laser diode section 34'.

In the integrated circuit having the above structure, light generated in the active layer 22 is made coherent by the grating 26, and is led to the optical modulator section 36' through the light absorption layer 3 and the optical waveguide layer 20-2.

In a case where an integrated circuit is formed of optical elements, it is necessary to electrically isolate the optical elements from one another while making the light coupling efficiency high among the optical elements. In order to form optical elements which are different in structure from each other, it is necessary to carry out the selective growth of crystal a multiplicity of times, and thus abnormal growth is apt to generate at the interface between crystals. Accordingly, it is difficult to enhance the light coupling efficiency between the optical elements. In the present embodiment, also, the abnormal growth 28 is generated in the connection part, as shown in FIG. 7C. In the present embodiment, however, the optical wave-guide layer 20-2 is common to the optical modulator section 36' and the laser diode section 34'. Thus, the light coupling between the sections 36' and 34' is scarcely affected by the abnormal growth, and high coupling efficiency is obtained.

Further, since the upper p-type region between the optical modulator section 36' and the laser diode section 34' as a connection part is removed, and a semi-insulative layer made of, for example, Fe-doped InP is formed in place of the p-type region, the both sections 34' and 36' are electrically insulated from each other without producing any effect upon light coupling efficiency.

In the structure of FIG. 7C, the light absorption layer 3 is extended from the optical modulator section 36' to the laser diode section 34'. However, it is not always required to extend the light absorption layer 3 to the laser diode section 34', since light output from the laser diode section 34' can be propagated to the optical modulator section 36' through the optical waveguide layer 20-2.

Further, optical elements can be integrated in such a manner that the optical waveguide layer is fabricated in the form of a pattern, that the optical elements are formed on or above the optical waveguide layer, and that a semi-insulative layer which does not transmit light, is formed between optical elements. For example, input and output patterns are formed of the optical waveguide layer, and an optical element is formed so as to stretch over the input and output patterns. Thus, the optical element can receive light from the input pattern, and can supply to the output pattern a light signal which indicates the result of processing carried out by the optical element. In this case, when the input portion of the optical element is made smaller in refractive index than the optical waveguide layer and the output portion of the optical element is made greater in refractive index than the optical waveguide layer, the light coupling efficiency between the optical element and each of the input and output patterns is improved.

What is claimed is:

1. An optical modulator comprising;
    two cladding layers respectively doped into different conductive types;
    a light absorption layer formed between said cladding layers for propagating incident light and for absorbing the light in response to a voltage applied between said cladding layers;
    an optical waveguide layer formed between the cladding layers and optically and operatively connected to the light absorption layer for propagating the light; and
    a layer transparent to the light in which the optical modulator is buried.

2. An optical modulator comprising:
    light absorbing means for propagating incident light and for absorbing the light in response to an applied voltage;
    light guiding means formed in at least a portion of a periphery of said light absorbing means and approximate to said light absorbing means for propagating the light, wherein said light guiding means is a light waveguide layer of a channel type which has a width corresponding to a width of said light absorbing means;
    confining means formed around said light absorbing means and said light guiding means for substantially confining the light in said light absorbing means and said light guiding means; and
    means for applying a voltage to said light absorbing means through said confining means, in response to an input signal.

3. An optical modulator according to claim 2, wherein said light absorbing means is made of material having an absorption edge at a wavelength shorter than a wavelength of the light, and has a refractive index higher than that of said confining means.

4. An optical modulator according to claim 2, wherein said light guiding means is made of material having an absorption edge at a wavelength shorter than a wavelength of the light, and has a refractive index higher than that of said confining means.

5. An optical transmitter comprising:
    light emitting means for generating light which has a substantially constant wavelength;
    multiplexing means for multiplexing inputted electric signals; and
    optical modulation means for carrying out intensity modulation for the light from said light emitting means in accordance with a multiplexed signal from said multiplexing means, said optical modulation means comprising.
    light absorbing means for propagating the light and for absorbing the light in response to an applied voltage, light guiding means formed in at least a portion of a periphery of said light absorbing means and optically connected to said light absorbing means, for propagating the light, confining means formed around said light absorbing means and said light guiding means, for confining the light in said light absorbing means and said light guiding means, and means for applying the voltage to said light absorbing means through said confining means in response to the multiplexed signal.

6. An optical transmitter according to claim 5, wherein each of said light absorbing means and said light guiding means is made of material having an absorption edge at a wavelength shorter than a wavelength of the light, and has a refractive index higher than that of said confining means.

7. An optical transmitter according to claim 5, wherein material and thickness of each of said light absorbing means and said light guiding means are selected so that total change in refractive index is negative or zero, the total change being defined by a sum of products of light confinement factors and corresponding change in refractive index due to the applied voltage for each of said light absorbing means and said light guiding mean.

8. An optical transmitter according to claim 5, wherein each of said light absorbing means and said light guiding means is formed of a multiple quantum well structure, and thickness and material of each of their well and barrier layers are selected so that each of said light absorbing means and said light guiding means has a predetermined refractive index and an absorption edge at a predetermined wavelength.

9. An optical transmitter according to claim 6, wherein a portion of said light absorbing means, or a portion of said light guiding means and all portion of said light absorbing means is undoped to form a p-i-n structure from said confining means, said light absorbing means and said light guiding means.

10. An optical transmitter according to claim 5, wherein said light emitting means and said optical modulation means are integrated on a single substrate.

11. An optical communication system comprising:
light transmitting means comprising:
light emitting means for generating light which has a substantially constant wavelength,
multiplexing means for multiplexing inputted electric signals, and
optical modulation means for carrying out intensity modulation for the light from said light emitting means in accordance with a multiplexed signal from said multiplexing means,
wherein said optical modulation means comprises light absorbing means for propagating the light and for absorbing the light in response to an applied voltage, light guiding means formed in at least a portion of a periphery of said light absorption means, for propagating the light, confinement means formed around said light absorption means and said light guiding means for confining the light in said light absorption means and said light guiding means and means for applying the voltage to said light absorption means through said confinement means in response to an input signal;
transmission means connected to said light transmitting means for propagating an intensity-modulated light signal; and reception means connected to the transmission means and receiving the intensity-modulated light signal for converting the intensity-modulated light signal into a received electric signal and for decomposing the received electric signal into a plurality of output signals to be delivered.

12. An optical communication system according to claim 11, wherein said light emitting means and said optical modulation means are integrated on a single substrate.

13. An optical device integrated circuit comprising:
a waveguide layer formed on a substrate;
a laser diode formed on said waveguide layer;
an optical modulator formed on said waveguide layer at a position proximate to said laser diode; and
an insulating layer formed on that portion of said waveguide layer where said laser diode and said optical modulator does not exist, and on said substrate, for electrically insulating said optical modulator from said laser diode.

14. An optical device integrated circuit according to claim 13, wherein said optical modulator comprises:
a cladding layer of different conductive type from said substrate, and
a light absorption layer formed between said cladding layer and said waveguide layer, for propagating light from said laser diode and for absorbing the light in response to a voltage applied between said cladding layer and said substrate.

15. An optical device integrated circuit according to claim 14, wherein said light absorption layer is extended along said waveguide layer to said laser diode in place of said insulating layer between said laser diode and said optical modulator.

16. An optical device integrated circuit according to claim 13, wherein said laser diode comprises:
an active layer formed on said waveguide layer;
an electrode layer of a different conductive type from said substrate; and
grating formed between said waveguide layer and said substrate under said laser diode.

17. An optical modulator comprising:
two cladding layers respectively doped into different conductive types;
a light absorption layer formed between said cladding layers for propagating incident light and for absorbing the light in response to a voltage applied between said cladding layers;
an optical waveguide layer formed between the cladding layers and optically and operatively connected to the light absorption layer for propagating the light; and
a layer in which the optical modulator is buried and which has a refractive index smaller than a refractive index of said optical waveguide layer.

18. An optical modulator comprising:
light absorbing means for propagating incident light and for absorbing the light in response to an applied voltage;
light guiding means formed in at least a portion of a periphery of said light absorbing means and approximate to said light absorbing means for propagating the light;
confining means formed around said light absorption means and said light guiding means for substantially confining the light in said light absorbing means and said light guiding means for substantially confining the light in said light absorbing means and said light guiding means; and means for applying a voltage to said light absorbing means through said confining means, in response to an input signal;

wherein a crystal for forming said light guiding means is arranged so that change in its refractive index for the light due to its electrooptic effect is negative.

19. An optical modulator comprising:

light absorbing means for propagating incident light and for absorbing the light in response to an applied voltage;

light guiding means formed in at least a portion of a periphery of said light absorbing means and approximate to said light absorbing means for propagating the light;

confining means formed around said light absorbing means and said light guiding means for substantially confining the light in said light absorbing means and said light guiding means for substantially confining the light in said light absorbing means and said light guiding means; and means for applying a voltage to said light absorbing means through said confining means, in response to an input signal;

wherein when the voltage is applied, said light absorbing means has a positive change in refractive index and said light guiding means has a negative change in refractive index.

20. An optical modulator comprising:

light absorbing means for propagating incident light and for absorbing the light in response to an applied voltage;

light guiding means formed in at least a portion of a periphery of said light absorbing means and approximate to said light absorbing means for propagating the light;

confining means formed around said light absorbing means and said light guiding means for substantially confining the light in said light absorbing means and said light guiding means; and means for applying a voltage to said light absorbing means through said confining means, in response to an input signal;

wherein thickness and material of each of said light absorbing means and said light guiding means are selected so that total change in refractive index is negative or zero, the total change being defined by a sum of products of light confinement factors and corresponding changes in refractive indexes due to the applied voltage for each of said light absorbing means and said light guiding means.

21. An optical modulator comprising:

light absorbing means for propagating incident light and for absorbing the light in response to an applied voltage;

light guiding means formed in at least a portion of a periphery of said light absorbing means and approximate to said light absorbing means for propagating the light;

confining means formed around said light absorbing means and said light guiding means for substantially confining the light in said light absorbing means and said light guiding means; and means for applying a voltage to said light absorbing means through said confining means, in response to an input signal;

wherein said light absorbing means and said light guiding means are formed of multiple quantum well structure, and thickness and material of each of their well and barrier layers are selected so that each of said light absorbing means and said light guiding means has a predetermined refractive index and an absorption edge at a predetermined wavelength.

22. An optical modulator comprising:

two cladding layers respectively doped into different conductive types;

a light absorption layer formed between said cladding layers for propagating incident light and for absorbing the light in response to a voltage applied between said cladding layers; and an optical waveguide layer formed between the cladding layers and optically and operatively connected to the light absorption layer for propagating the light;

wherein one of said cladding layers is a substrate; and wherein in a case where the crystal plane orientation of the substrate and a direction in which the voltage is applied are, a direction of crystal growth of said optical waveguide is, and wherein in a case where the crystal plane orientation of the substrate and a direction in which the voltage is applied are, the crystal growth direction of said optical waveguide is.

23. An optical modulator according to claim 22, wherein each of said light absorption layer and said optical waveguide layer is formed in a multiple quantum well structure, and thickness and material of each of well and barrier layers of the multiple quantum well structure are selected so that each of said light absorption layer and said optical waveguide layer has a predetermined refractive index and an absorption edge at a predetermined wavelength.

24. An optical modulator according to claim 22, further comprising a layer transparent to the light for burying the optical modulator therein.

25. An optical modulator according to claim 22, further comprising a layer in which the optical modulator is buried and which has a refractive index smaller than a refractive index of said optical waveguide layer.

* * * * *

UNITED STATES PATENT AND TRADEMARK OFFICE
CERTIFICATE OF CORRECTION

PATENT NO. : 5,339,370
DATED : 16 August 1994
INVENTOR(S) : Hirohisa SANO et al.

It is certified that error appears in the above-indentified patent and that said Letters Patent is hereby corrected as shown below:

| Column | Line | |
|---|---|---|
| 1 | 7 | Change "07/682,698" to --07/682,678--. |
| 7 | 16 | Change "Coupling" to --coupling--. |
| 8 | 16 | Delete "of FIG. 6A". |
| 8 | 17 | After "embodiment" insert --of FIG. 6A--. |
| 9 | 51 | Before "both" delete "the". |
| 11 | 26 | Change "mean" to --means--. |
| 11 | 37 | After "all" delete "portion". |
| 14 | 37 | After "are" insert --[100]--. |
| 14 | 38 | After "is" insert --[011]--. |
| 14 | 40 | After "are" insert --[011]--. |
| 14 | 42 | After "is" insert --[110]--. |

Signed and Sealed this

Fourth Day of April, 1995

Attest:

BRUCE LEHMAN

Attesting Officer     Commissioner of Patents and Trademarks